United States Patent
Kamata et al.

(10) Patent No.: US 6,593,618 B2
(45) Date of Patent: Jul. 15, 2003

(54) MIS SEMICONDUCTOR DEVICE HAVING AN ELEVATED SOURCE/DRAIN STRUCTURE

(75) Inventors: Yoshiki Kamata, Kanagawa-ken (JP); Akira Nishiyama, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 15 days.

(21) Appl. No.: 09/994,606

(22) Filed: Nov. 28, 2001

(65) Prior Publication Data

US 2002/0063299 A1 May 30, 2002

(30) Foreign Application Priority Data

Nov. 28, 2000 (JP) ........................................ 2000-361455

(51) Int. Cl.[7] .............................................. H01L 29/76
(52) U.S. Cl. ........................ 257/327; 257/329; 257/410; 257/493

(58) Field of Search ................................. 257/382, 384, 257/389, 640, 327, 178, 329, 309, 302, 344, 493, 410, 320

(56) References Cited

U.S. PATENT DOCUMENTS 6,232,641 B1 * 5/2001 Miyano et al. ............. 257/382
2001/0045597 A1 * 11/2001 Nishinohara ................ 257/329

* cited by examiner

Primary Examiner—Olik Chaudhuri
Assistant Examiner—Yennhu B. Huynh
(74) Attorney, Agent, or Firm—Oblon, Spivak, McClelland, Maier & Neustadt, P.C.

(57) ABSTRACT

In the first aspect of the invention, a semiconductor device can effectively suppress the adverse short channel effect and the possible occurrence of junction leak current and has a low resistance diffusion layer to realize a short propagation delay time as a plurality of side wall films 4, 5 are formed at least in a part of the area between the gate electrode 3 and an elevated region 8 by laying a plurality of films in an appropriate order.

11 Claims, 18 Drawing Sheets

(g)

(h)

(i)

(j)

(a)

(b)

(c)

(d)

(e)

(f)

(g)

(h)

(i)

(j)

(k)

(l)

(a)

(b)

(c)

(a)

(b)

(a)

(b)

(a)

(b)

(a)

(b)

(a)

(b)

(a)

(b)

(c)

(a)

(b)

(c)

MIS SEMICONDUCTOR DEVICE HAVING AN ELEVATED SOURCE/DRAIN STRUCTURE

CROSS-REFERENCE TO RELATED APPLICATIONS

This application is based upon and claims the benefits of priority from the prior Japanese Patent Application No. 2000-361455, filed on Nov. 28, 2000, the entire contents of which are incorporated herein by reference.

BACKGROUND OF THE INVENTION

1. Field of the Invention

This invention relates to a semiconductor device and a method of manufacturing the same. More particularly, it relates to an MIS type semiconductor device having an elevated source/drain structure and a method of manufacturing the same.

2. Description of the Related Art

Currently, integrated circuits formed by integrally arranging a number of transistors and resistors on a semiconductor substrate are popularly being used in essential parts of computers and communication devices. Due to the trend toward a higher degree of integration of devices, many of the dimensions defined by applicable design rules are becoming smaller and smaller. In the case of MIS type semiconductor devices, the diffusion layer is required to be made shallow in order to suppress the short channel effect that arises as a result of a reduced gate length. However, at the same time, the increase in the resistance of the diffusion layer due to the reduced depth thereof has to be avoided. In an attempt at reducing the depth of the diffusion layer and, at the same time, avoiding the resultant increase of the resistance thereof, there has been proposed a technique of combining a structure where only the silicon in the source/drain region is raised, or a so-called elevated source/drain structure, and the use of silicide, which is a compound of silicon and metal, formed in a self-aligning manner (T. Yoshitomi, et al., 1995 Symposium on VLSI Technology Digest of Technical Papers, p. 11).

Several methods have been proposed for forming such an elevated source/drain structure. They include vapor phase epitaxial growth and solid phase epitaxial growth. However, when an epitaxial growth technique is used, facets are produced near the gate oxide film and the element isolation zone to make it impossible to provide a sufficiently large thickness in the vicinity of those areas for the film formed by epitaxial growth. Particularly, as a result of a small thickness of the epitaxially grown film in an area near the gate, impurities can be implanted deep into the substrate in the subsequent ion implantation step to give rise to the problem of a short channel effect. Additionally, the problem of a junction leak arises in the succeeding silicide step because of the short distance from the pn junction. Then, an additional step for forming a side wall on the elevated source/drain region is required to be conducted before the silicide step in order to suppress the leak due to the silicide to consequently increase the number of manufacturing steps. Furthermore, as elements are miniaturized, both the distance between the gate electrode and the source region and the distance between the gate electrode and the drain region are reduced to give rise to a risk of short-circuiting.

Because of the above-identified problems and other problems, there is a strong demand for a semiconductor device having an elevated source/drain structure that has a shallow and low-resistance diffusion layer and is free from the problems of leak and short-circuiting.

BRIEF SUMMARY OF THE INVENTION

An first aspect of the present invention, there is provided a semiconductor device comprising:

a silicon substrate;

a gate insulating film formed on a surface of the silicon substrate;

a gate electrode formed on the gate insulating film;

a first side wall film formed on a side surface of the gate electrode, and extending to the surface of the silicon substrate;

an elevated region formed by epitaxial growth of silicon on the surface of the silicon substrate;

a second side wall film formed on the first side wall film, being made of different material from the first side wall film and separated from the surface of the silicon substrate by the elevated region; and a source region and a drain region formed in the silicon substrate and having a same conductive type with the elevated region.

A multilayer type side wall films are formed on the respective side surfaces of the gate electrode of each MIS type element such as a transistor or a resistance by laying a number of layers that are directed toward a surface of the silicon substrate. With this arrangement, the leak current that can be generated by the tunnel phenomenon between the gate and the source or the drain is effectively suppressed.

Of the walls, the wall located close to the gate electrode is referred to as the first side wall film and the one formed remote from the gate electrode is referred to as the second side wall film. Then, a gap is formed between the second side wall film and the top surface of the silicon substrate and the materials used for the first side wall film and their equivalents are eliminated from the gap to arrange an elevated source/drain region there in order to reduce the distance between the region and the channel. As a result, the distance between the diffusion layer of the substrate located below the region and the part of the channel located below the gate edge is reduced to by turn reduce both the reach of impurity diffusion and the depth of the diffusion layer in the diffusion layer forming process and consequently suppress the short channel effect.

Both the short channel effect and the leak can be further reduced by suppressing the generation of facets in the epitaxial growth process and by filling the elevated region in the gap between the second side wall film and the silicon substrate. Generally, crystal facets having a specific facet index are formed in the epitaxial growth process to suppress the epitaxial growth in the direction of the facet. Particularly, in the case of solid phase epitaxial growth, the (110) plane grows at a rate about twice as slow as the (100) plane, whereas the (111) plane shows a growth rate twenty times as low as the (100) plane. While a silicon substrate having a (100) plane is generally used, not only a (100) plane but also a (110) plane and a (111) plane that show a low growth rate are formed in the solid phase epitaxial growth process. Similarly, in the case of vapor phase epitaxial growth, a (311) plane is apt to be formed. When the DHF process is insufficient, the epitaxially grown film produces facets due to the gate insulating film. It is believed that the amorphous silicon (to be referred to as a-Si hereinafter) deposited on the insulting film is bonded, if weakly, to atoms of the insulating film and such facets reflect the difference in the bond energy.

As a result of a series of experiments conducted by the inventor of the present invention, it is found that such facets are apt to be produced more in the vicinity of a silicon oxide film than in the vicinity of a silicon nitride film. Therefore, if the gate insulating film is formed from an oxide film, facets are formed due to the oxide film but, on the other hand if an epitaxially grown facet is made to contact the lower end of the side wall film of silicon nitride film, it is possible to realize epitaxial growth on the side wall film without forming facets because of the existence of the silicon nitride film. In the case of solid phase epitaxial growth, while the etched region under the second side wall film is completely filled with amorphous silicon and hence facets are formed in the subsequent solid phase epitaxial growth process, all the amorphous silicon filling the etched region is crystallized if the solid phase epitaxial growth process is conducted thoroughly because the epitaxial growth, if slow, takes place also on the facets.

The elevated region can be made to grow in contact with the surface of the second side wall film and also extend under the second side wall film to provide a sufficient film thickness for the epitaxially grown film near the second side wall film so that the silicide film can be sufficiently isolated from the pn junction to satisfactorily suppress any leak attributable to the silicide film.

The structure forming a space surrounded between the first side wall film and the elevated region isolates the elevated source/drain from the gate electrode by the space with a low dielectric constant to reduce the parasitic capacitance.

In another aspect of the invention, a multilayer film structure, or a structure having a plurality of side wall films, is formed in at least part of the area between the gate electrode and the elevated source/drain region by means of a method as described below.

Namely, in the aspect of the invention, there is provided a method of manufacturing a semiconductor device comprising:

forming a gate insulating film on a silicon substrate;

forming a gate electrode on the gate insulating film;

forming a first insulating film to cover the gate insulating film and the gate electrode;

forming a second insulating film on the first insulating film with a material different from that of the first insulating film;

selectively leaving the second insulating film on a side surface of the gate electrode with the first insulating film interposed therebetween by etching a surface of the second insulating film and using the first insulating film as etching stopper;

exposing the surface of the silicon substrate by removing the first insulating film not covered with the second insulating film;

forming an elevated region on the exposed surface of the silicon substrate by epitaxial growth of silicon; and changing at least a surface layer of the elevated region into metal silicide film.

The above method may be partly modified so as to make the epitaxially grown film contain a conductive type impurity by causing gas containing the conductive type impurity substance to flow in the epitaxial growth step. Then, the operation of ion implantation and that of partly removing the side wall films can be omitted to simplify the overall process.

DETAILED DESCRIPTION OF THE INVENTION (1st Embodiment)

Figure 1A:
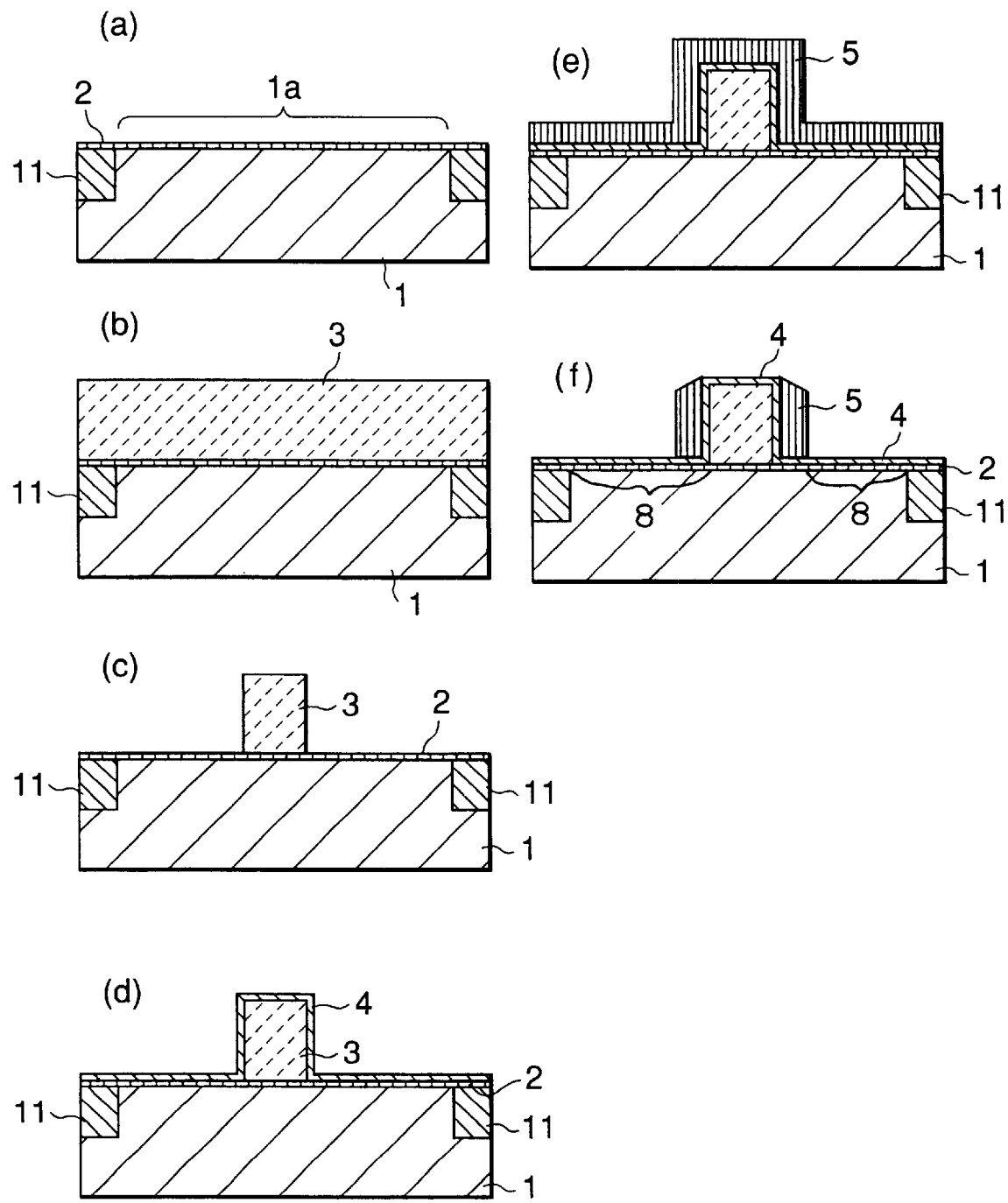
FIGS. 1A and 1B are schematic cross sectional views of the first embodiment of the present invention, illustrating different steps (a) to (j) of a method of manufacturing an MIS type transistor having multilayer type side wall films and an elevated source/drain region raised vertically upwardly from the interface of the silicon substrate and the gate insulating film.
Figure 1B:
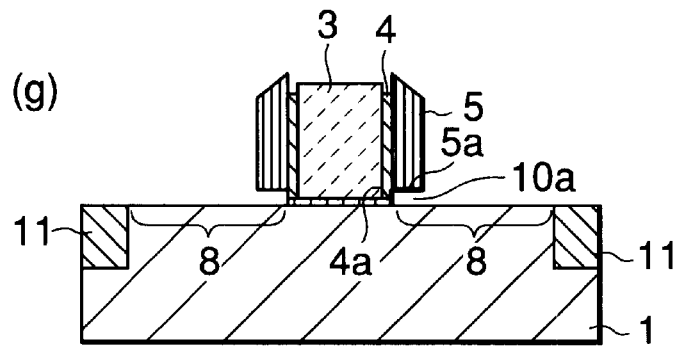
Figure 1B:
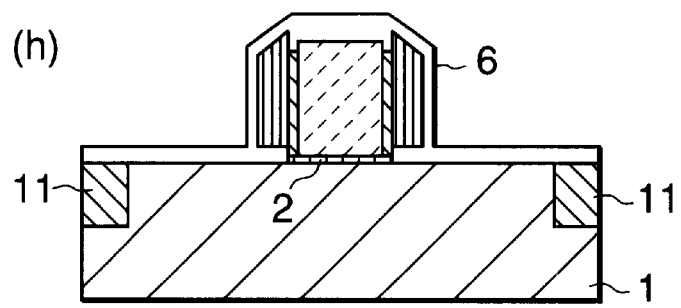
Figure 1B:
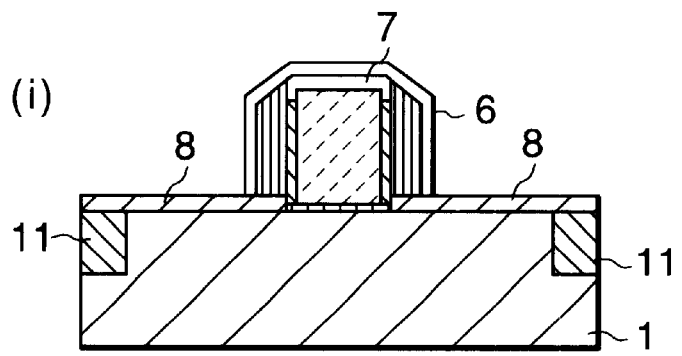
Figure 1B:
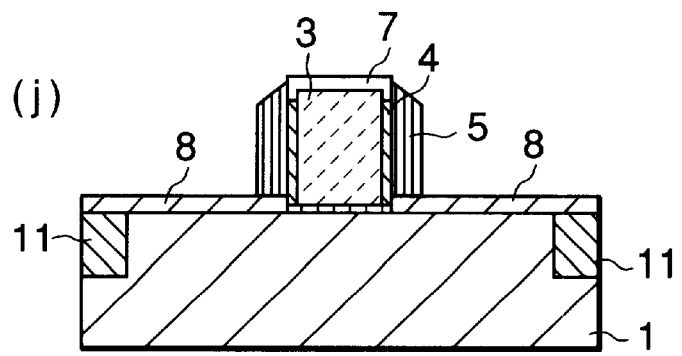

FIGS. 1A through 1B are schematic cross sectional views of the first embodiment of the present invention, illustrating different manufacturing steps thereof. Firstly, shallow trench isolation zones (STI) 11 are formed on a semiconductor substrate 1 made of silicon to define an element region 1a (FIG. 1A(a)). Then, a gate electrode 3 is formed by depositing polycrystalline silicon (FIG. 1A(b)) and, after a lithography step, the gate electrode is processed by means of an anisotropic etching technique using plasma such as RIE (reactive ion etching (FIG. 1A(c)). Subsequently, the gate electrode is oxidized (to be referred to as post-gate oxidization step hereinafter) to produce a first side wall film 4 (FIG. 1A(d)). The surface layer that becomes a source region/a drain region is also oxidized in the post-gate oxidization step. Then, a silicon nitride film ($Si_3N_4$) 5 is deposited in a CVD (chemical vapor deposition) system (FIG. 1A(e)) and subsequently a silicon nitride film is formed only on the lateral side of the gate electrode by anisotropic etching using plasma (FIG. 1A(f)). Note that no problem arises if the gate insulating film and the silicon oxide film on the source region/drain region 8 are partly scraped off by the anisotropic etching using plasma.

If necessary, a liner layer that may be a silicon oxide film ($SiO_2$) may be formed by deposition using a CVD system and additionally an annealing step may be provided before the deposition of the silicon nitride film 5. A sputtering system or an evaporation system may be used to replace the CVD system for forming the liner layer and the silicon nitride film by deposition. The liner layer is not limited to a silicon oxide film and a multilayer film made of a plurality of materials may alternatively be used for the liner layer.

Hereinafter, when both a post-gate oxide film (including an oxide film on the source/drain region) and a liner layer are provided, they are collectively referred to as the first side wall film and the silicon nitride film 5 at the side of the gate electrode is referred to as the second side wall film. When still another film is formed beside the silicon nitride film, these films are collectively referred to as the second side wall film. It should be noted that the second side wall film is not limited to a silicon nitride film and the silicon substrate may contain Ge. The gate insulating film may be a silicon oxide film, a silicon nitride film, a high dielectric constant film such as an oxide film with higher dielectric constant than the silicon oxide, containing at least an element selected from a group of Ti, Zr, Hf, Ta, La, Al Ba, Sr, Y, Pr and Gd, and a silicate film containing such an element.

The film may be a single crystal film, a poly crystal film or an amorphous film such as $TiO_2$, $Ti_2O_5$, BST, $Si_3N_4$, $Al_2O_3$, $Y_2O_3$, $La_2O_3$, $HfO_2$, $ZrO_2$, $Pr_2O_3$, $SrTiO_3$ and $Gd_2O_3$. Furthermore, the film may be made of a mixture of $SiO_2$, $TiO_2$, $Ti_2O_5$, BST, $Si_3N_4$, $Al_2O_3$, $Y_2O_3$, $La_2O_3$, $HfO_2$, $ZrO_2$, $Pr_2O_3$, $SrTiO_3$ or $Gd_2O_3$, with ti, Zr, Hf, Ta, La, Al Ba, Sr, Y, Pr or Gd.

It is desired that a SiOx ($0<x\leq2$) layer or the layer containing N is interposed between the gate insulating film and the silicon substrate or between the gate insulating film and the gate electrode of poly silicon.

In case that the dielectric constant of the film is higher, a distance is still separated the elevated region from the gate electrode to reduce the parasitic capacitance, consequently, the gate insulating film with high dielectric constant being expected at high speed operation of FET compared with a FET using the $SiO_2$ Gate film.

After forming the second side wall film 5 as shown in FIG. 1A(f), the silicon oxide films 2, 4 on the source/drain region 8 on the silicon substrate and on the gate electrode 3 are etched out by using dilute hydrofluoric acid (DHF). The part of the first side wall film located between the second side wall film and the silicon substrate is completely etched out in this step (FIG. 1B(g)). As a result of this etching step, a gap 10a is produced between the surface of the silicon substrate and the end 5a of the second side wall film 5 apart from the substrate. The film thickness of the part 4a of the first side wall film 4 is made equal to that of the remaining first side wall film. Thereafter, an amorphous silicon (a-Si) layer 6 is formed by deposition at temperature between 550 and 750° C. in an LP-CVD (low pressure chemical vapor deposition) system (FIG. 1B(h)). Subsequently, the work is annealed at temperature lower than 750° C. and the source/drain region 8 of the silicon substrate 1 is used as seed for solid phase epitaxial growth to produce an elevated source/drain region 8 that is raised from the interface of the gate insulating film and the silicon substrate (FIG. 1B(i)).

If necessary, the amorphous silicon layer formed on the gate electrode 3 and the second sidewall film 5 without epitaxial growth is etched. When the deposited amorphous silicon layer has a thickness of 100 nm, the amorphous silicon layer that is formed without epitaxial growth can be removed completely relative to the epitaxially grown crystalline silicon layer by etching it by means of an etchant which is a 1 : 80 : 120 mixture of (49%) hydrofluoric acid, (70%) nitric acid and pure water for five minutes (FIG. 1B(j)). The a-Si layer 6 on the gate electrode partly remains there as it becomes a polysilicon layer 7 in the above step shown in FIG. 1B(j).

The above described process may be modified in a manner as described below, After the step of FIG. 2A(b), a silicon nitride film ($Si_3N_4$) 9 is formed by deposition (FIG. 2A(a)) and then the silicon nitride film and the gate electrode 3 are treated by anisotropic plasma etching (FIG. 2A(b)). Then, the gate electrode 3 and the surface of the substrate are oxidized to produce a silicon oxide film 4 these (FIG. 2A(c))

and subsequently a silicon nitride film 5 is formed there by deposition (FIG. 2A(d)). Then, the silicon nitride film is also treated by anisotropic plasma etching (FIG. 2B(e)) and the silicon oxide film 41 in the source/drain region 8 on the silicon substrate is removed by etching, using dilute hydrofluoric acid (DHF) solution. Thus, after forming an a-Si layer 6 by deposition (FIG. 2B(f)), it is possible to form an epitaxially grown layer only in the source/drain region 8 by means of solid phase epitaxial growth without producing any epitaxial growth on the gate electrode (FIG. 2B(g)). Note that the gate electrode 3 may formed be as a multilayer film layer made of silicon and silicide or metal or as a metal layer. While this embodiment is described hereinafter in terms of epitaxial growth on the gate electrode 5, epitaxial growth may not be introduced on the without departing from the scope of the invention.

A UHV-CVD (ultra high volume chemical vapor deposition) system may be used for depositing the a-Si layer 6 and oxygen may exist at a surface density lower than that of the back bond on the silicon surface in the seed area of epitaxial growth. It is possible to deposit an a-Si layer 6 containing conductive type impurities (including P, As and/or B) by flowing conductive type impurities such as phosphine ($PH_3$), arsine ($AsH_3$) and/or diborane ($B_2H_6$) simultaneously at the time of depositing the a-Si layer 6. Note that the a-Si layer may contain any of such conductive type impurities in this embodiment.

The dilute hydrofluoric acid solution used for the above etching process may be replaced by vapor phase hydrofluoric acid and the etching process may be that of anisotropic etching using plasma such as RIE. No space exists between the elevated source/drain region 8 formed by solid phase epitaxial growth and side wall films including the first side wall film 4 and the second side wall film 5 (see FIG. 2B(g) and symbol 10b in FIG. 7(b)).

Figure 2A:
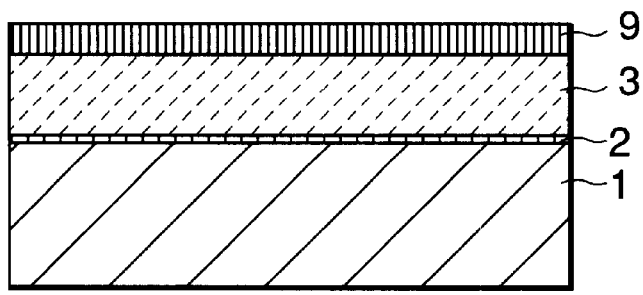
FIGS. 2A through 2C are schematic cross sectional views of another embodiment of the present invention obtained by modifying the first embodiment, illustrating different steps (a) to (l) of a method of manufacturing a transistor having an elevated source/drain region raised vertically upwardly from the interface of the silicon substrate and the gate insulating film and formed by means of a solid epitaxial growth process.
Figure 2A:
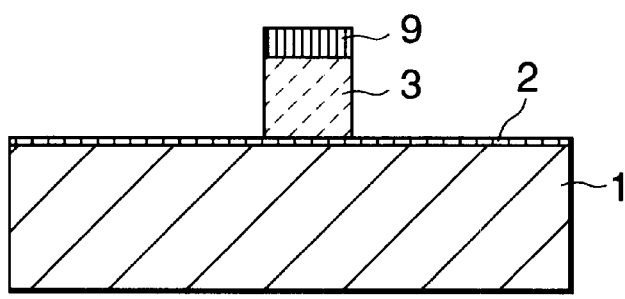
Figure 2A:
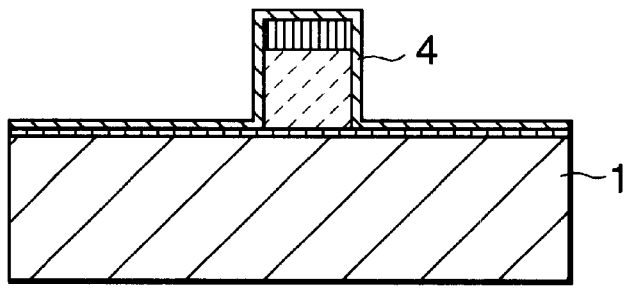
Figure 2A:
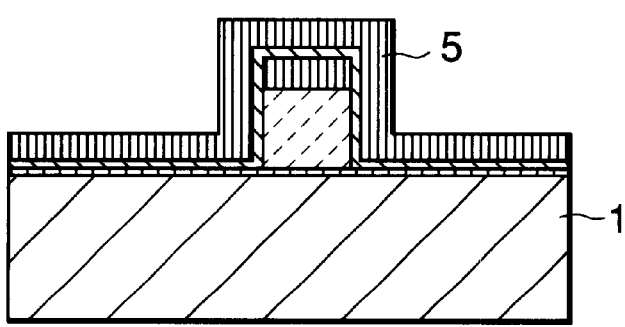
Figure 2B:
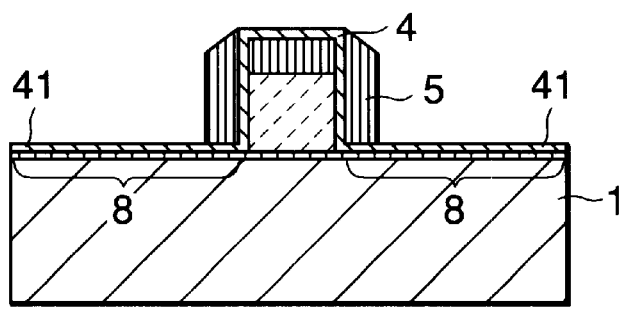
Figure 2B:
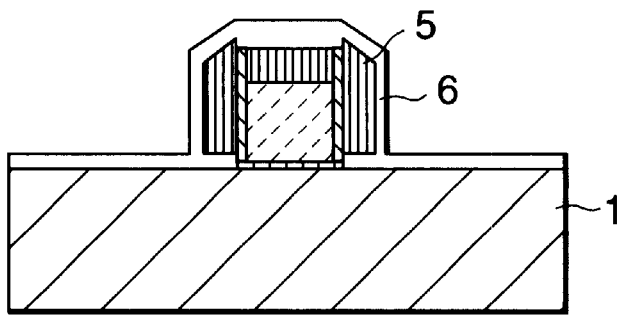
Figure 2B:
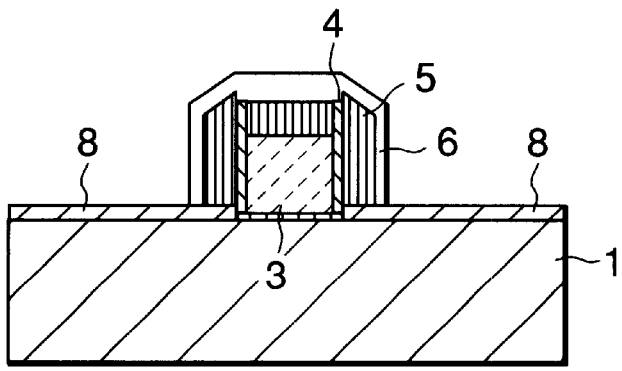
Figure 2B:
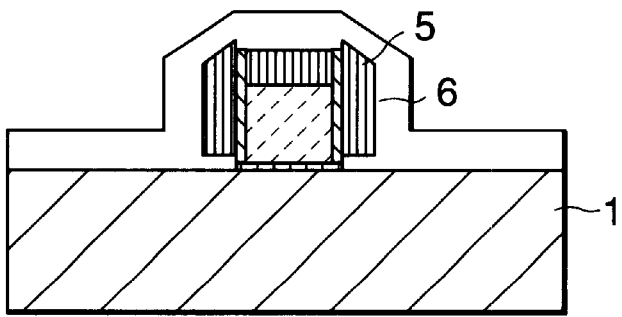
Figure 2C:
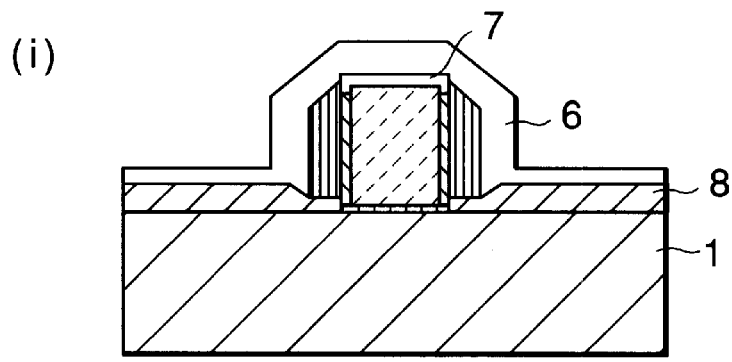
Figure 2C:
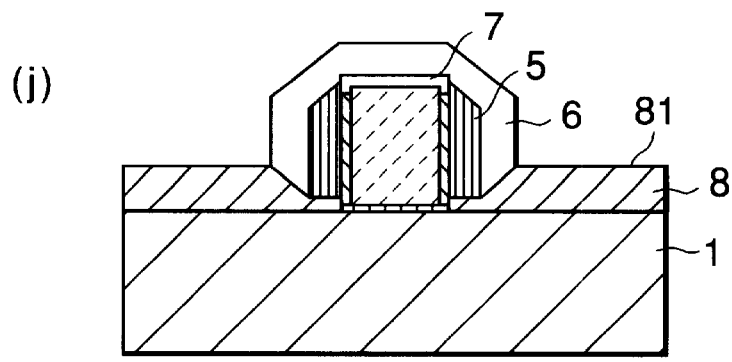
Figure 2C:
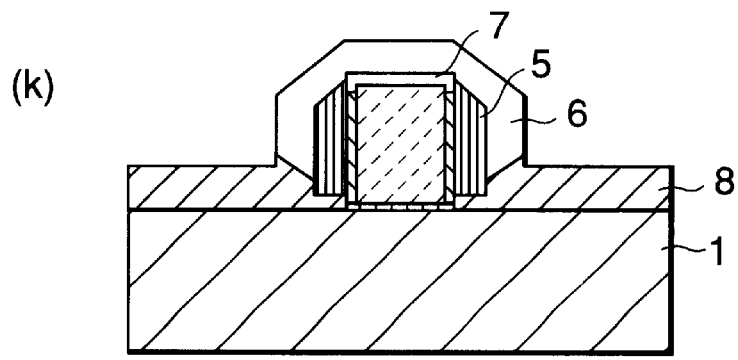
Figure 2C:
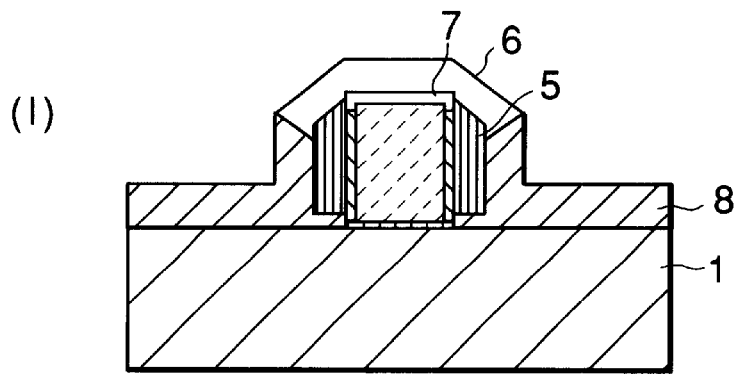

When the deposited a-Si layer has a large film thickness (FIG. 2B(h)), the solid phase epitaxial growth at the lateral side of the second side wall film may take any of the forms show in FIGS. 2C(i) through 2C(l). FIG. 2C(i) shows a form of epitaxial growth where only a lower part of the deposited layer 6 becomes an epitaxially grown layer 8 and the remaining upper part remains as amorphous silicon layer 6. In FIG. 2C(j), the epitaxially grown layer 8 partly gets to the surface 81. FIG. 2C(k) shows still another form of epitaxial growth where the part of the epitaxially grown film that is held in contact with the side wall film 5 has a thickness smaller than the part that is made to grow up to the surface but the film thickness in part of the facet formed on the side all 5 is greater than that of the part made to grow to the surface. In FIG. 2C(l), the film thickness is greater in the region held in contact with the side wall film than in the region where the film is made to grow up to the surface. The gate insulating film may be made of a dielectric substrate showing a high dielectric constant such as $SiO_2$ or SiON and it is desirable that that, in the etching operation using DHF, the gate insulating film shows an etching rate smaller that the silicon oxide film in order to suppress any possible short circuiting between the gate electrode and the source region or the drain region after the epitaxial growth process. Particularly, it is desirable that the nitrogen concentration is high at and near the surface because, in the etching operation using DHF, the silicon oxide film shows an etching rate about 10 times greater than the silicon oxide/nitride film.

(2nd Embodiment)

Figure 3:
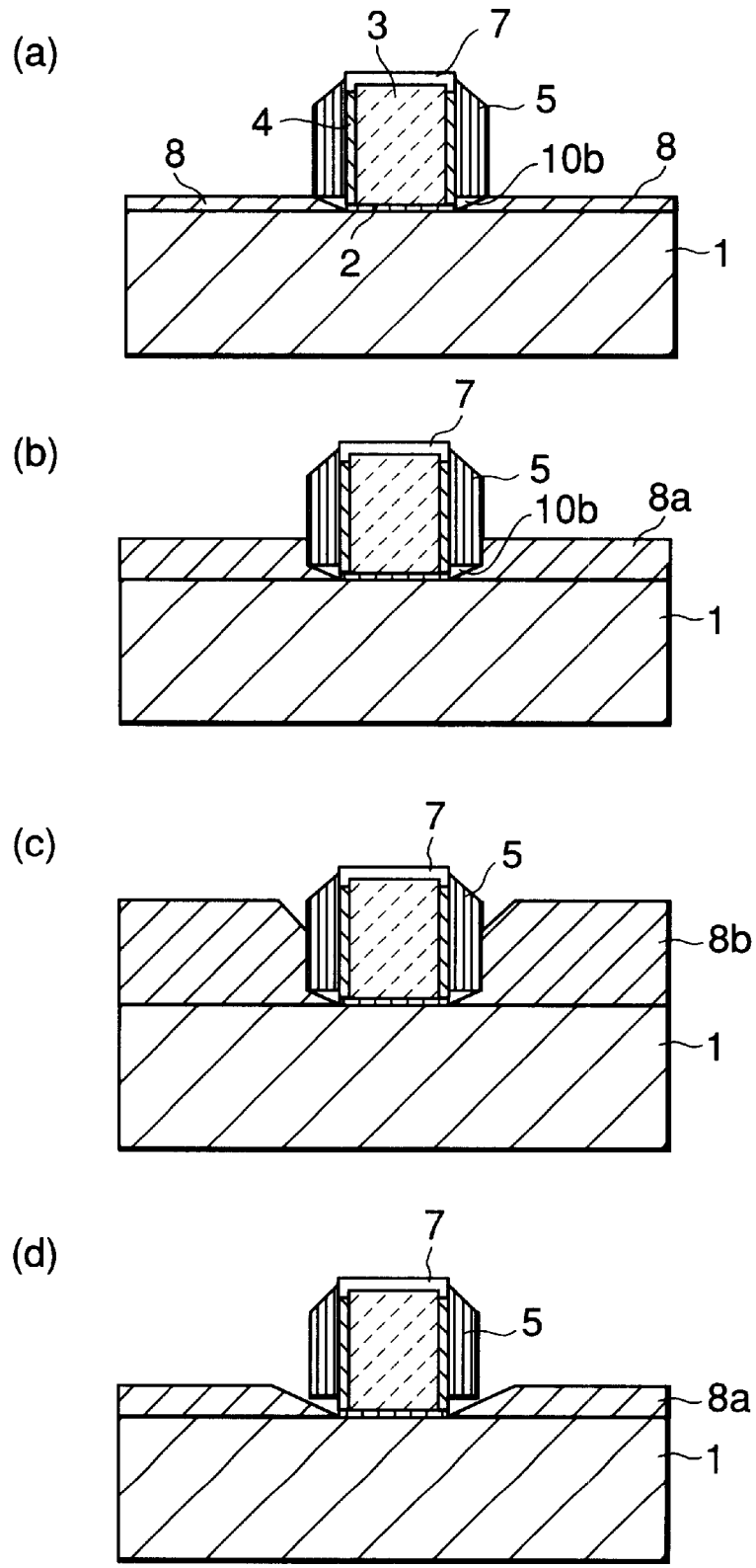
FIG. 3 shows schematic cross sectional views of the second embodiment of the present invention, illustrating different steps (a) to (d) of a method of manufacturing a transistor having an elevated source/drain region raised vertically upwardly from the interface of the silicon substrate and the gate insulating film and formed by means of a vapor epitaxial growth process.

This embodiment of the present invention is described according to FIG. 3. This embodiment differs from the above described first embodiment only in that solid phase epitaxial growth of the first embodiment is replaced by vapor phase epitaxial growth in this embodiment. Otherwise, the manufacturing steps of this embodiment are identical with those of the first embodiment. Therefore, in FIGS. 3A through 3C, the parts that are same as or similar to those of the first embodiment are denoted respectively by the same reference symbols. However, it should be noted that facets are formed in the epitaxially grown region of this embodiment that is produced by vapor phase epitaxial growth and a space 10b exists between the first and second side wall films and the epitaxially grown film (FIG. 3(a)). The region produced on the second side wall film by vapor phase epitaxial growth may take any of the forms shown in FIGS. 3(b), 3(c) and 3(d) depending on the thickness of the epitaxially grown film. In FIG. 3B, the epitaxially grown layer 8a is formed without facets and held in contact with the second side wall film 5. In FIG. 3(c), the epitaxially grown layer 8b is formed with facets and held in contact with the second side wall film 5. In FIG. 3(d), the epitaxial grown layer 8c is formed without contacting the second side wall film 5.

The space 10b separates the gate electrode from the elevated source/drain, consequently reducing the parasitic capacitance due to low dielectric constant of the space.

(3rd Embodiment)

Figure 4:
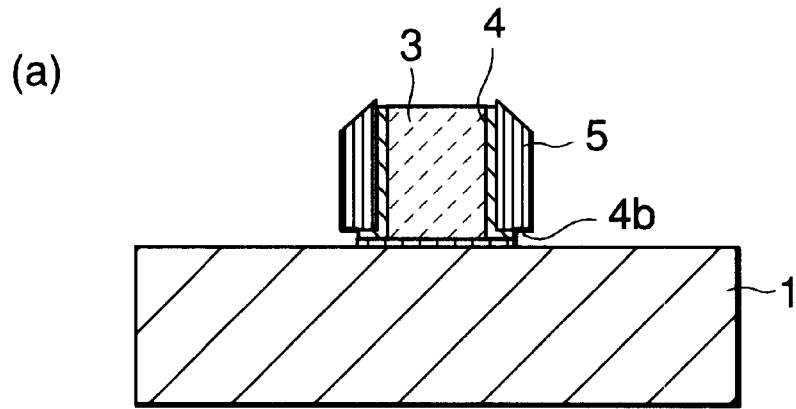
FIG. 4 shows schematic cross sectional views of the third embodiment of the present invention, illustrating different steps (a) to (c) of a method of manufacturing a transistor having an elevated source/drain region raised vertically upwardly from the interface of the silicon substrate and the gate insulating film and formed by means of a solid epitaxial growth process.
Figure 4:
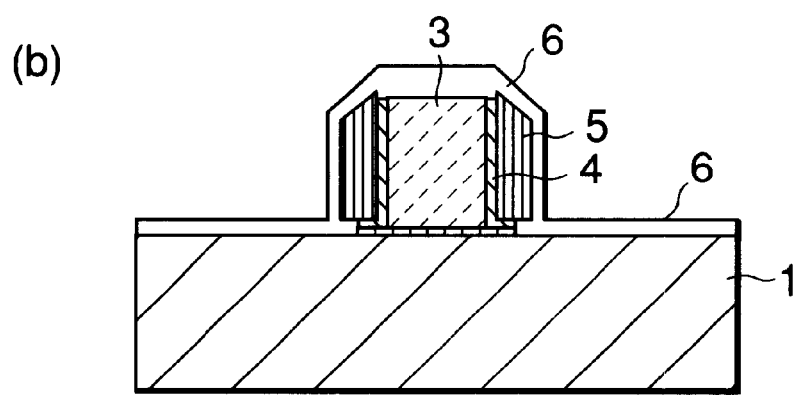
Figure 4:
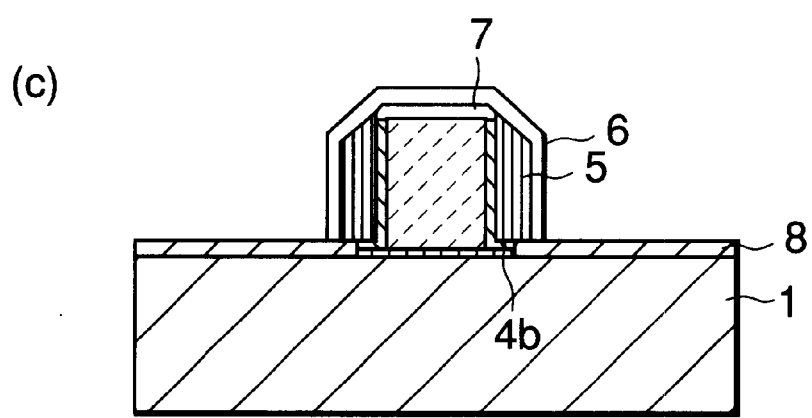

FIG. 4 shows the third embodiment of the present invention. This embodiment differs from the first embodiment only in that the first side wall film between the second side wall film and the silicon substrate is partly left without being etched. Otherwise, all the manufacturing steps of the first embodiment are applicable to this embodiment. In FIG. 4(a) through (c), the parts that are same as or similar to those of the first embodiment are denoted respectively by the same reference symbols.

(4th Embodiment)

Figure 5:
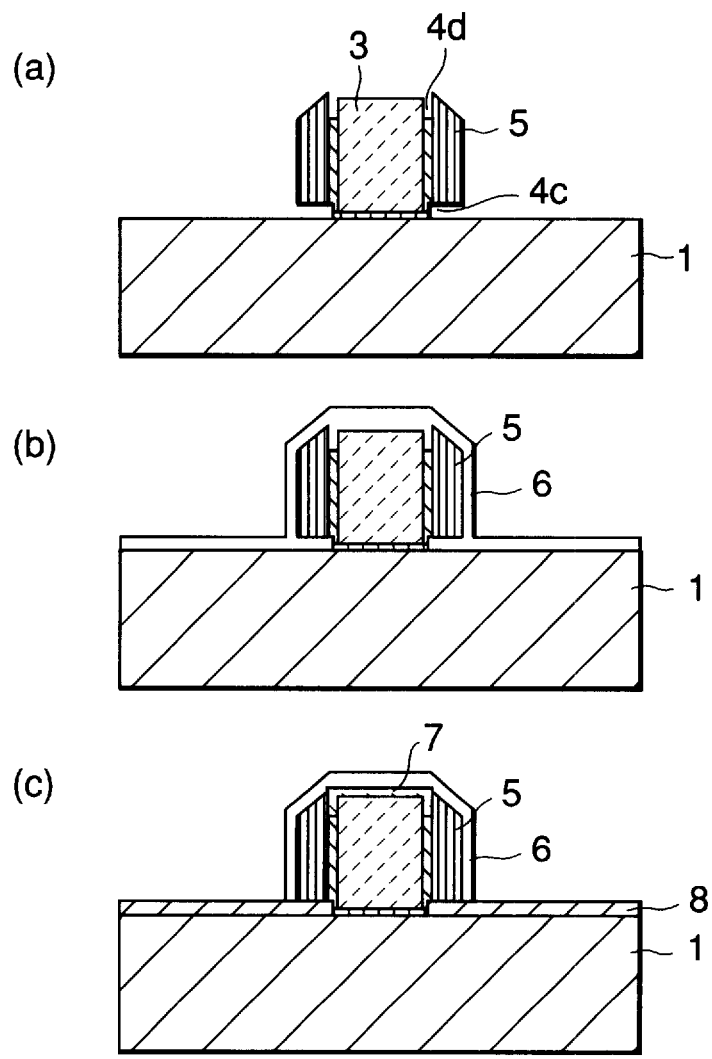
FIG. 5 shows schematic cross sectional views of the fourth embodiment of the present invention, illustrating different steps (a) to (c) of a method of manufacturing a transistor having an elevated source/drain region raised vertically upwardly from the interface of the silicon substrate and the gate insulating film and formed by means of a solid epitaxial growth process.

FIG. 5 shows the fifth embodiment of the present invention. This embodiment differs from the first embodiment only in that the first side wall film completely removed by etching in an area 4d between the second side wall film 5 and the silicon substrate land also removed by etching in another area 4c between the second side wall film 5 and the gate electrode 3 to reduce the film thickness if compared with the remaining part of the first side wall film. Otherwise, this embodiment is same as the first embodiment. Therefore, in FIGS. 5(a) through (c), the parts that are same as or similar to those of the first embodiment are denoted respectively by the same reference symbols.

(5th Embodiment)

Figure 6:
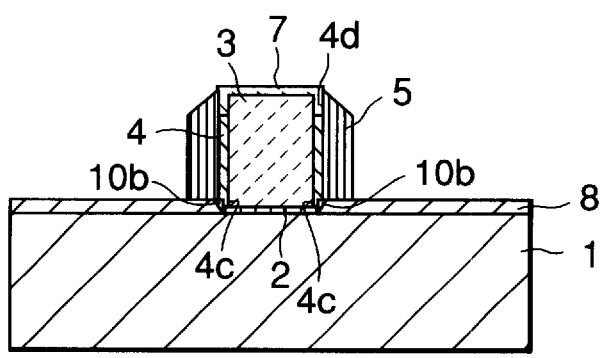
FIG. 6 is a schematic cross sectional view of the fifth embodiment of the present invention, illustrating a step of a method of manufacturing a transistor having an elevated source/drain region raised vertically upwardly from the interface of the silicon substrate and the gate insulating film and formed by means of a vapor epitaxial growth process.

FIG. 6 is a schematic cross sectional view of the fifth embodiment of the present invention. This embodiment differs from the second embodiment only in that the first side wall film is completely removed by etching in an area between the second side wall film 5 and the silicon substrate 1 and partly removed in an area 4c between the second side wall film and the gate electrode. Therefore, in FIG. 6, the parts that are same as or similar to those of the second embodiment are denoted respectively by the same reference symbols.

(6th Embodiment)

Figure 7:
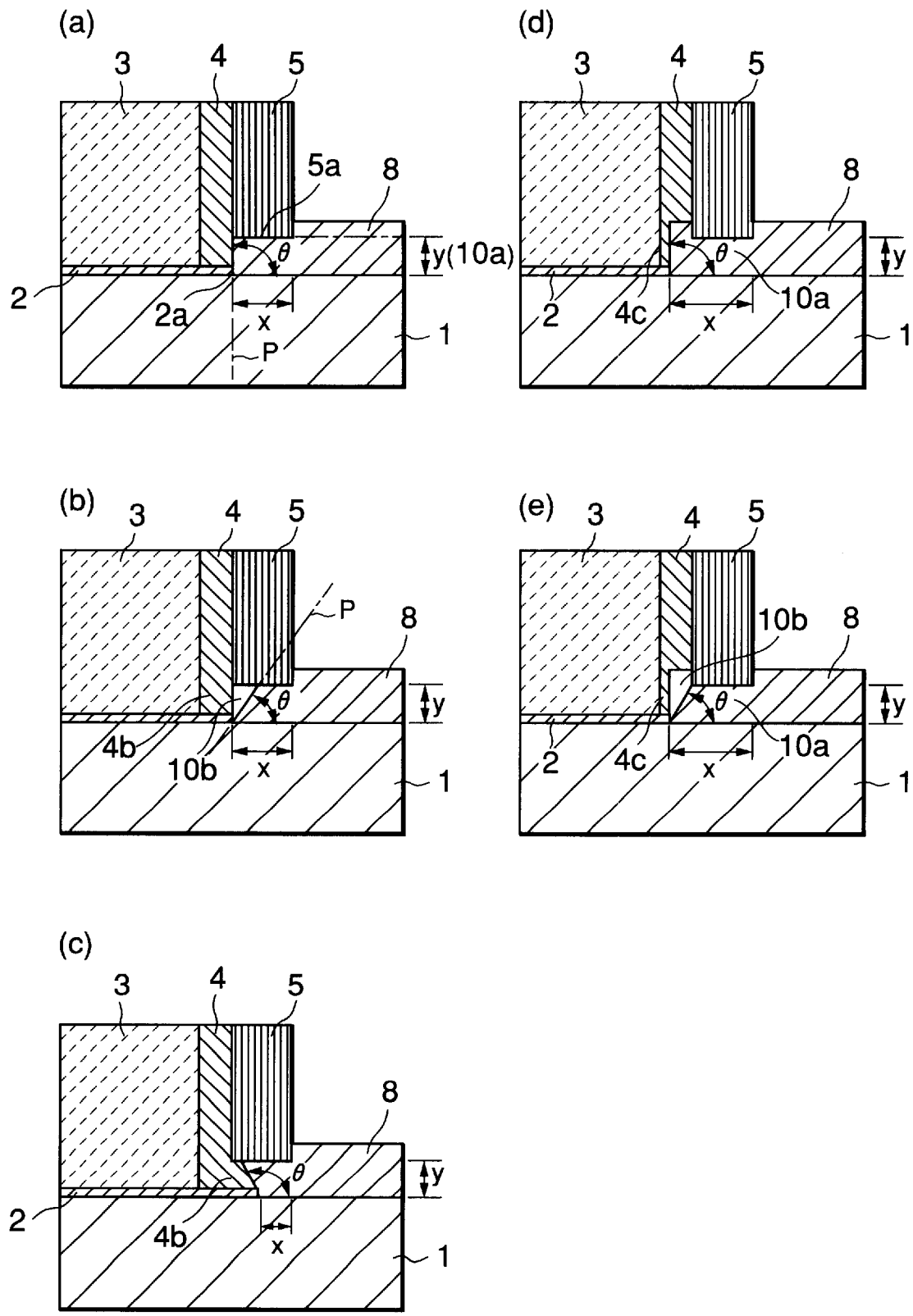
FIG. 7 shows schematic cross sectional views of structures (a) to (e) of the sixth embodiment of the present invention.

As shown in FIG. 7, the sixth embodiment differs from the first, third, fourth or fifth embodiment only in that, when the first side wall film is etched by x under the second side wall film and the distance separating the lower end 5a of the second side wall film 5 and the silicon substrate 1 in the vertical distance is y, while the angle of the contact plane P of the epitaxially grown film and the silicon substrate is θ, this embodiment satisfies the relationship defined by formal 1) below.

$$x > y/\tan\theta \quad (1)$$

Note that length x in the above formula represents the distance between the end 2a of the gate insulating film 2 and the outer peripheral edge of the second side wall film 5. Otherwise, this embodiment is same as any of the above listed embodiments.

FIG. 7(a) corresponds to the first embodiment and the part 4a of the first side wall film 4 has a thickness same as the remaining part of the first sidewall film 4. The gap 10a produced by etching a lower part of the second side wall film 5, using DHF, and located between the lower end 5a and the silicon substrate 1 is filled as a result of solid phase epitaxial growth of the a-Si layer (which is turned into a crystalline Si layer 8 by heat treatment).

FIG. 7(b) corresponds to the second embodiment and the gap 10a produced by etching, using DHF, and located between the lower end 5a of the second side wall film 5 and the silicon substrate 1 is filled as a result of solid phase epitaxial growth, although a space 10b is left there.

FIG. 7(c) corresponds to the third embodiment and the first side wall film 4 is etched under the second side wall film by DHF in such a way that a part 4b of the first side wall film 4 shows a thickness greater than that of the remaining part of the first side wall film 4. The gap 10a produced by etching, using DHF, and located between the lower end 5a of the second sidewall film 5 and the silicon substrate 1 is filled as a result of solid phase epitaxial growth if the a-Si layer (which is turned into a crystalline Si layer 8 by heat treatment). The length (x) of this embodiment differs from that of the first embodiment shown in FIG. 7(a).

FIG. 7(d) corresponds to the fourth embodiment and a part 4c of the first side wall film 4 is made to show a thickness smaller than that of the remaining part of the first side wall film 4 and the gap under the second side wall film 5 produced by etching, using DHF, is filled as a result of solid phase epitaxial growth of the a-Si layer, although the length (x) differs from that of FIG. 7(a) and that of FIG. 7(c).

In order that the length x is designed to become larger, a bottom portion surrounded among the substrate, the first side wall film and the second sidewall film are formed by over-etching rather than the distance in vertical direction on the substrate of the gap 10a. The film thickness of the elevated region filled in the bottom portion is thicker than the distance of the gap 10a.

FIG. 7(e) corresponds to the fifth embodiment and a part 4c of the first side wall film 4 is made to show a thickness smaller than that of the remaining part of the first side wall film and the gap under the second side wall film 5 produced by etching, using DHF, is filled as a result of vapor phase epitaxial growth, although the length (x) and the angle θ are different from those of FIG. 7(a) and those of FIG. 7(c). A space 10b also exists.

X, y and è are shown in each of FIGS. 7A through 7E. Regardless if solid phase epitaxial growth is used or vapor phase epitaxial is used, θ is defined by formula (2) below.

$$0 < \theta < \pi \quad (2)$$

However, particularly in the case of solid phase epitaxial growth, θ can be defined by formulas (3) and (4) below.

$$\pi/2 < \theta < \pi \quad (3)$$

and $$\tan\theta < 0 \quad (4)$$

Note that, throughout FIGS. 7(a) through (e), the parts that are same as or similar to those of FIGS. 1A through 6 are denoted respectively by the same reference symbols.

(7th Embodiment)

This embodiment is described according to FIGS. 8(a) and (b). All the manufacturing steps of the first through sixth embodiment are applicable to this embodiment. This embodiment differs from the first through sixth embodiments in that the epitaxially grown film 8 of this embodiment that is extending onto the top surface of the element isolation zone 11 (FIG. 8(a)). As a result of a series of experiments conducted prior to the present invention, the inventor of the invention found that, when the interface of the element isolation zone 11 and the active zone 1a is inclined toward the plane (100) from the plane (110), the epitaxially grown film 8 can be made to extend considerably onto the element isolation zone. In an experiment, the inventor of the present invention succeeded in forming a (110) facet plane and extending it laterally on the element isolation zone 11 by about 150 to 200 nm as a result of solid phase growth by conducting a rapid thermal annealing operation on a 100 nm thick a-Si layer at 680 to 700° C. for about 60 seconds.

If the length obtained by lateral epitaxial growth is t, the angle between a side end plane P1 of the elevated region by epitaxial growth and the initial surface of the silicon substrate is φ and the film thickness of the a-Si film is s, desirably their relationship is expressed by formula (5) below (FIG. 8(b)).

$$t > s/\tan\phi \quad (5)$$

A (100) substrate is used, the film thickness of the a-Si layer is 100 nm and the facet plane is a (100) plane in this embodiment. Therefore, the epitaxially grown film on the interface of the element isolation zone and the source region or the drain region can be made to suppress any possible leak current at or near the STI attributable to silicide when the epitaxially grown film can be made to grow laterally by more than 100 nm because the facet plane is a (100) plane.

Figure 8:
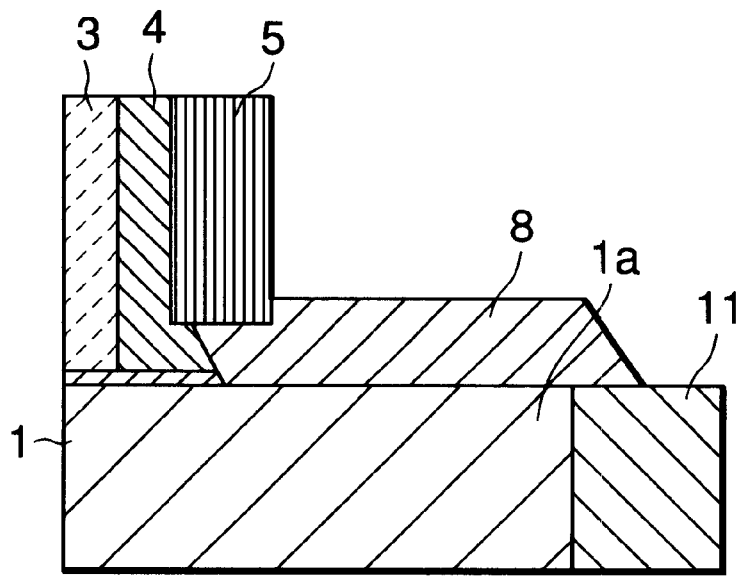
FIG. 8 shows schematic cross sectional views (a) and (b) of the seventh embodiment of the present invention that has an element laterally epitaxially grown on the element isolation zone, indicating the lateral extent t of epitaxial growth, the facet angle $\phi$ and the film thickness s of the epitaxial layer at the interface of the element isolation zone and the active region.
Figure 8:
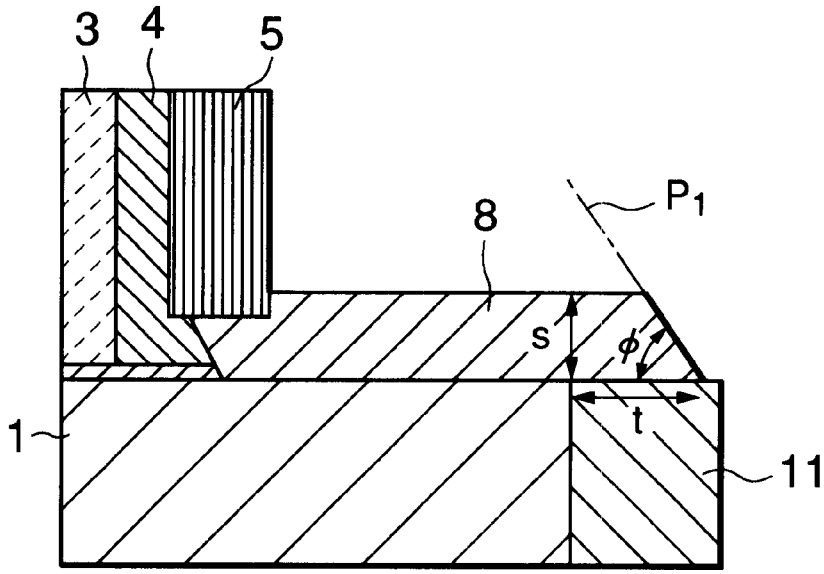

In FIG. 8, the parts that are same as or similar to those of FIGS. 2A through 2C are denoted respectively by the same reference symbols.

(8th Embodiment)

FIGS. 9(a) and (b) shows the eighth embodiment of the present invention. While all the manufacturing steps of the first through seventh embodiment are applicable to this embodiment, this embodiment differs from the preceding embodiments in that, after forming the epitaxially grown film 8, a diffusion region 12 is formed in the silicon substrate by solid phase diffusion. When the elevated region contains impurities, the diffusion region 12 can be formed by annealing the elevated region in order to diffuse impurities into the silicon substrate 1 by solid phase diffusion. Particularly, when the elevated region is formed by forming a silicon film, while causing gas containing impurities to flow, and epitaxially growing the silicon film, it is highly effective if the elevated region is made to contain beyond the solid solubility limit. If the distance between the gate end and the corresponding end of the epitaxially grown film (Yj in FIG. 9A) is not greater than 20 nm, a diffusion layer showing a low resistance and adapted to suppress the adverse short channel effect can be formed with an impurity concentration of about 1E18 (/cm$^3$) at the gate end and a depth as small as Yj by conducing the annealing operation at 800° C. for about 10 seconds in an RTA (rapid thermal annealing) system. The method for manufacturing this embodiment may additionally includes a step for implanting ions of impurities after forming an epitaxially grown film.

Figure 9:
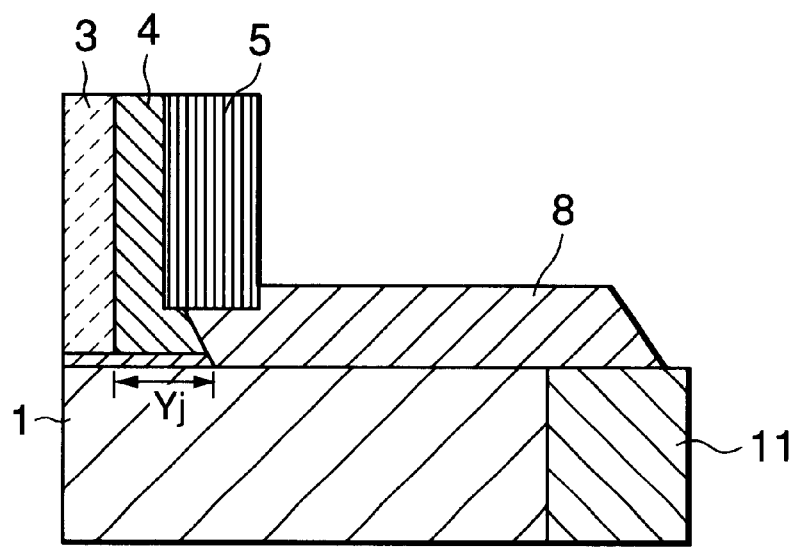
FIG. 9 shows schematic cross sectional views (a) and (b) of the eighth embodiment of the present invention, illustrating the distance from the gate end to the etching end and the depth of the diffusion layer.
Figure 9:
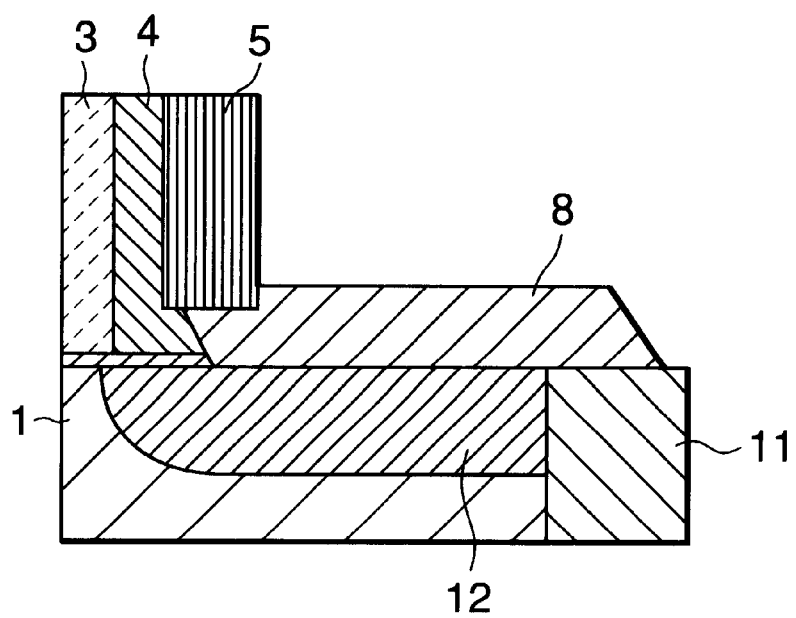

In FIG. 9, the parts that are same as or similar to those FIGS. 1A through 2C are denoted respectively by the same reference symbols. In FIG. 9, reference symbol 11 denotes an element isolation zone.

(9th Embodiment)

FIGS. 10(a) and (b) shows the ninth embodiment of the present invention. Referring to the figure, a diffusion layer 14 is formed by ion implantation. After processing the gate electrode 3, an extention region 13 is formed by implanting impurities into the silicon substrate through the gate insulating film and annealing the epitaxially grown film in an ion implantation system (FIG. 10(a)). Then, as in the case of the first through eighth embodiments, a deep diffusion region 14 is formed by forming an elevated source/drain region 8 on the side wall film 5, introducing impurities into a region of the silicon substrate 1 located deeper than the extended region 13 by ion implantation and annealing the epitaxially grown layer (FIG. 10(b)). The diffusion layer formed in this way shows a low resistance to suppress the adverse short channel effect.

Figure 10:
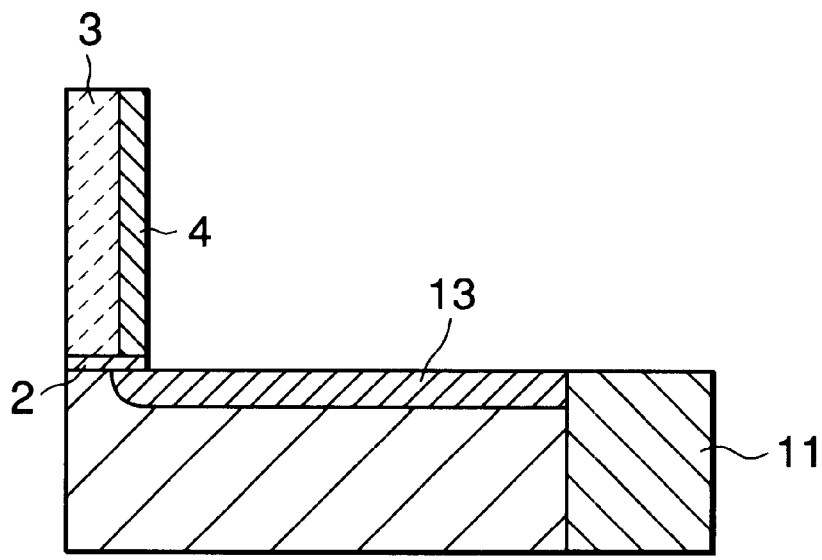
FIG. 10 shows schematic cross sectional views (a) and (b) of the ninth embodiment of the present invention, illustrating the diffusion layer in the extended and the deep region.
Figure 10:
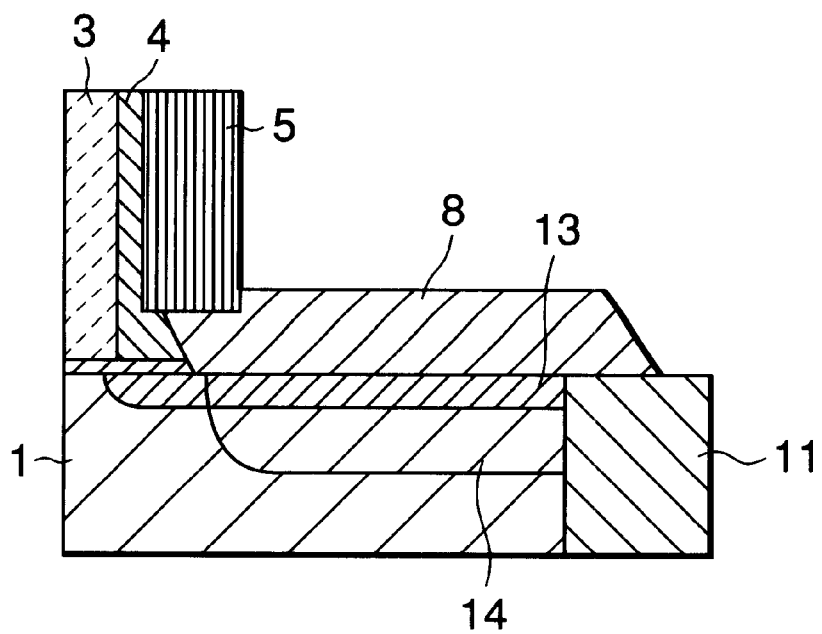

In FIG. 10, the portions that are same as or similar to those FIGS. 1A through 2C are denoted respectively by the same reference symbols. In FIG. 10, reference symbol 11 denotes an element isolation zone.

(10th Embodiment)

Figure 11:
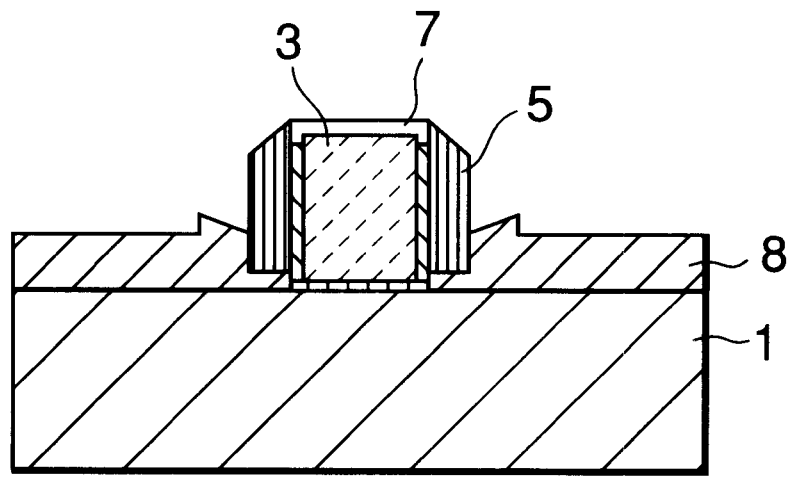
FIGS. 11 shows schematic cross sectional views of the tenth embodiment of the present invention, illustrating different steps (a) and (b) of a method of manufacturing an MIS type transistor containing silicide in the source region or the drain region.
Figure 11:
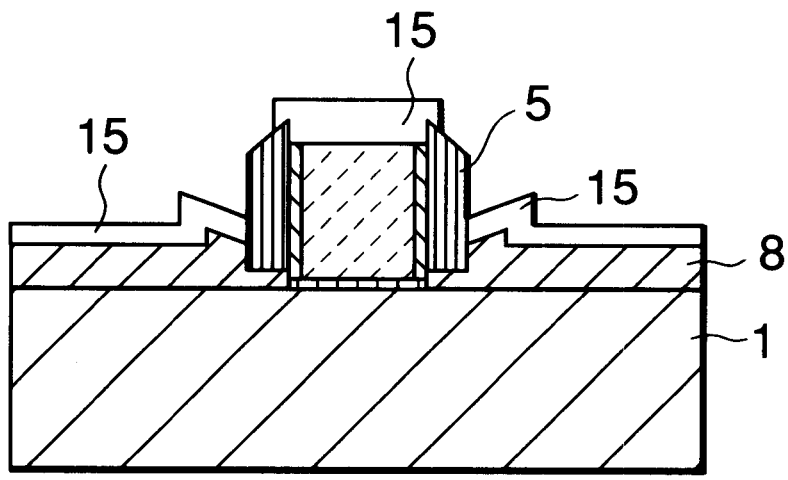

FIG. 11 shows the tenth embodiment of the present invention. This tenth embodiment differs from the preceding embodiments in that the diffusion layer is made to show a low resistance by turning the material of at least part of the elevated region 8 into silicide 15.

As in the case of the first through ninth embodiments, an elevated region 8 is formed by epitaxial growth (FIG. 11(a)). Then, the material of the elevated region 8 is partly turned into silicide in a silicide forming step (FIG. 11(b)). Particularly when polysilicon is formed on the gate electrode, the material of the surface of the gate electrode is also turned into silicide 15 to reduce the electric resistance of the gate electrode (FIG. 11(b)). In FIGS. 10A and 10B, the parts that are same as or similar to those FIGS. 1A through 2C are denoted respectively by the same reference symbols.

(11th Embodiment)

Figure 12:
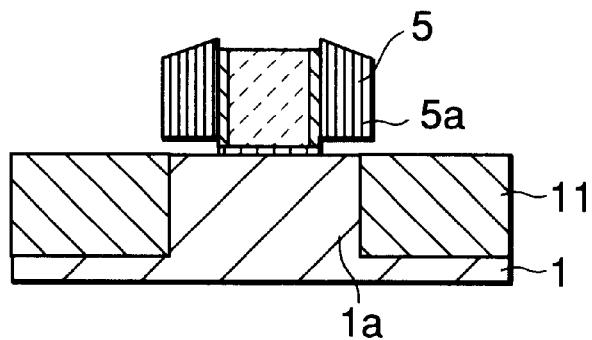
FIG. 12 shows schematic cross sectional views of the eleventh embodiment of the present invention, illustrating different steps (a) and (b) of a method of manufacturing an MIS type transistor having side wall films partly formed on the element isolation zone and having an elevated source/drain region.
Figure 12:
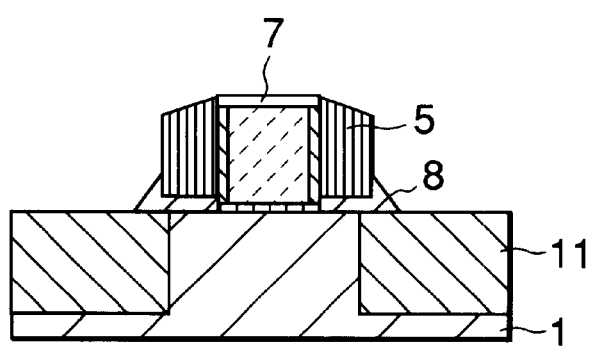

FIG. 12 shows the eleventh embodiment of the present invention. This embodiment differs from the tenth embodiment in that the side wall film is partly found also on the element isolation zone 11. The side wall film 5 is formed by following the steps of FIGS. 1A through 1F as in the case of the first embodiment. The side wall film is made to show a large thickness and extend to or beyond the proximal end of the isolation zone 11 so that the edge 15a of the side wall film may operate as eaves to cover the active region 1a. Then, the silicon oxide film is etched and an epitaxial growth process is conducted as in the first through sixth embodiments (FIG. 12(a)).

In FIG. 11, the parts that are same as or similar to those FIGS. 1A through 2C are denoted respectively by the same reference symbols.

(12th Embodiment)

Figure 13:
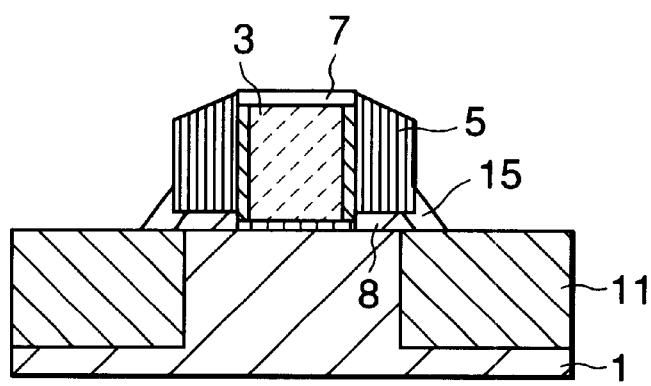
FIG. 13 is a schematic cross sectional view of the twelfth embodiment of the present invention, illustrating a step of a method of manufacturing an MIS type transistor having side wall films partly formed on the element isolation zone and having an elevated source/drain region whose material is partly turned to silicide.

FIG. 13 shows the twelfth embodiment of the present invention. This embodiment differs from the preceding embodiments in that, after the epitaxial growth process, at least part of the a-Si of the epitaxially grown film is turned into silicide 15 only in an area vertically above the element isolation zone 11. As shown in FIG. 12(b), the silicide film is formed in a self-aligning manner after the epitaxial growth process. In FIG. 13, he parts that are same as or similar to those FIGS. 1A through 2C are denoted respectively by the same reference symbols.

(13th Embodiment)

Figure 14:
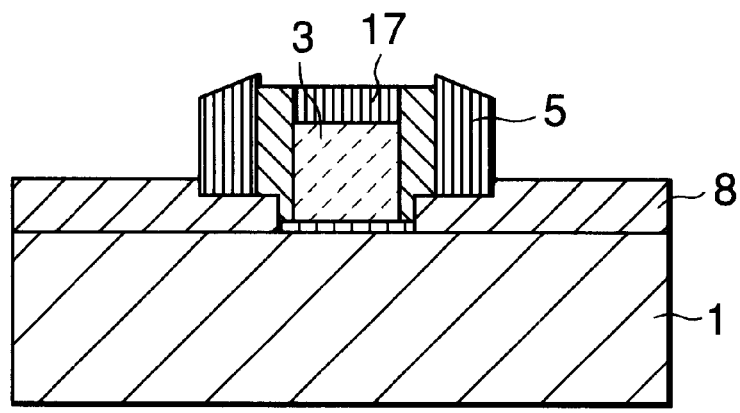
FIG. 14 shows schematic cross sectional views of the thirteenth embodiment of the present invention, illustrating different manufacturing steps (a) to (c) for etching the second side wall film.
Figure 14:
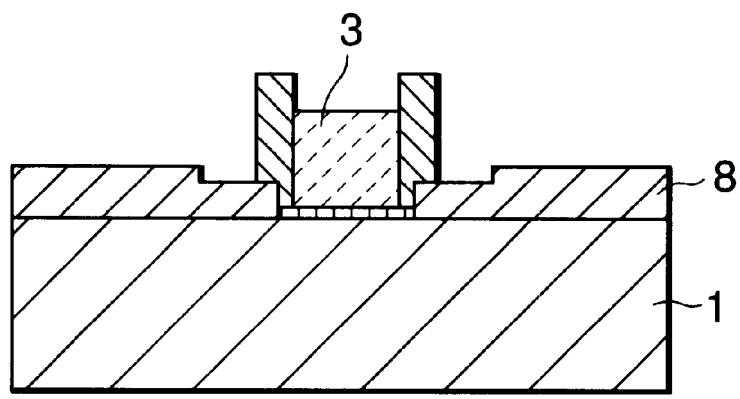
Figure 14:
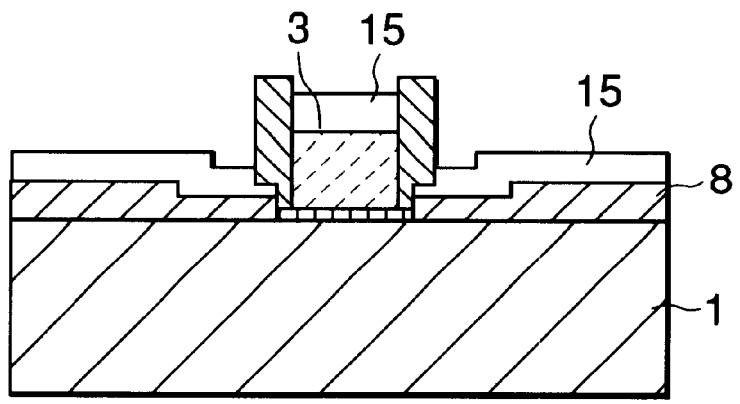

FIG. 14 shows the thirteenth embodiment of the present invention. The thirteenth embodiment differs from the preceding embodiment in that, after forming an elevated source/drain region 8 (FIG. 14(a)) and removing the part of the second wall 5 located on the elevated source/drain region 8 by etching (FIG. 14(b)), the material of the region 8 is turned into silicide 15 (FIG. 14(c)). The electric resistance of the source/drain region is reduced due to the silicide film that is a low resistance film extending in the region of the side wall film on the extended region near the channel. If necessary, impurities may be introduced into the extended region by lowly accelerated ion implantation and vapor phase diffusion after etching the second side wall film. While FIG. 14(a) shows an epitaxial growth suppressing layer 17 that is typically a silicon nitride film ($Si_3N_4$) formed on the gate, the layer 17 may be omitted. The silicide film 15 is formed after removing the silicon nitride ($Si_3N_4$) layers (5 and 17) by anisotropic etching, using hot phosphoric acid or plasma as shown in FIG. 14(b). In FIG. 14, the portions that are same as or similar to those FIGS. 1A through 2C are denoted respectively by the same reference symbols.

(14th Embodiment)

Figure 15:
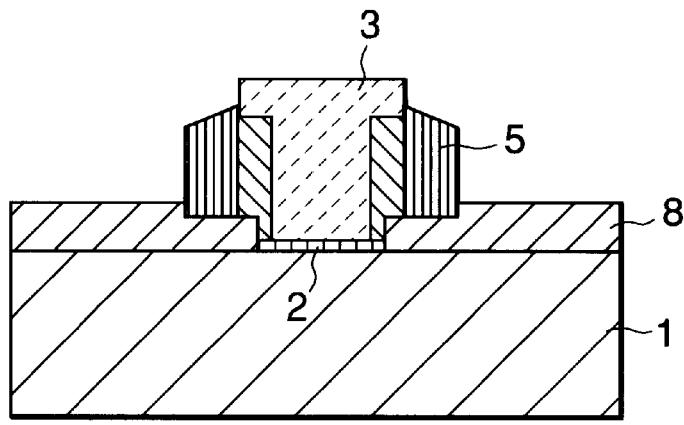
FIG. 15 shows schematic cross sectional views of the fourteenth embodiment of the present invention, illustrating different manufacturing steps (a) to (c) for etching the second side wall film.
Figure 15:
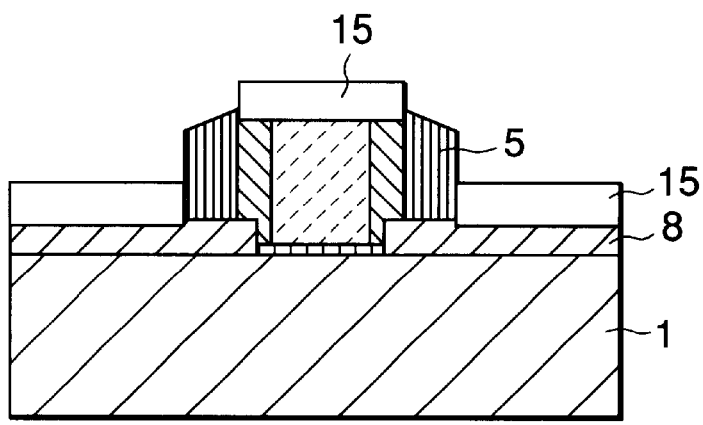
Figure 15:
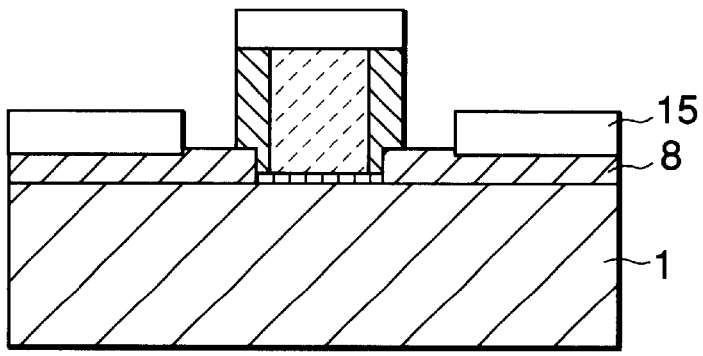

FIGS. 15(a) to (c) shows the fourteenth embodiment of the present invention. This embodiment differs from the thirteenth embodiment only in that, after forming an elevated source/drain region 8 and turning the material of the elevated source/drain region into silicide 15, the second sidewall film 5 on the elevated source/drain region 8 is etched. If necessary, impurities may be introduced into the extended region by lowly accelerated ion implantation and vapor phase diffusion after etching the second side wall film 5. As the second side wall film showing a relatively high dielectric constant is etched, the parasitic capacitance of the gate and the elevated source/drain region or only the latter can be reduced and the silicide film can be made remote from the extended region particularly in the area where the latter is bonded to the substrate so that the process of turning the silicon into silicide can be conducted with a wide margin because the process takes place in an area where the elevated source/drain region has a large film thickness.

(15th Embodiment)

Figure 16:
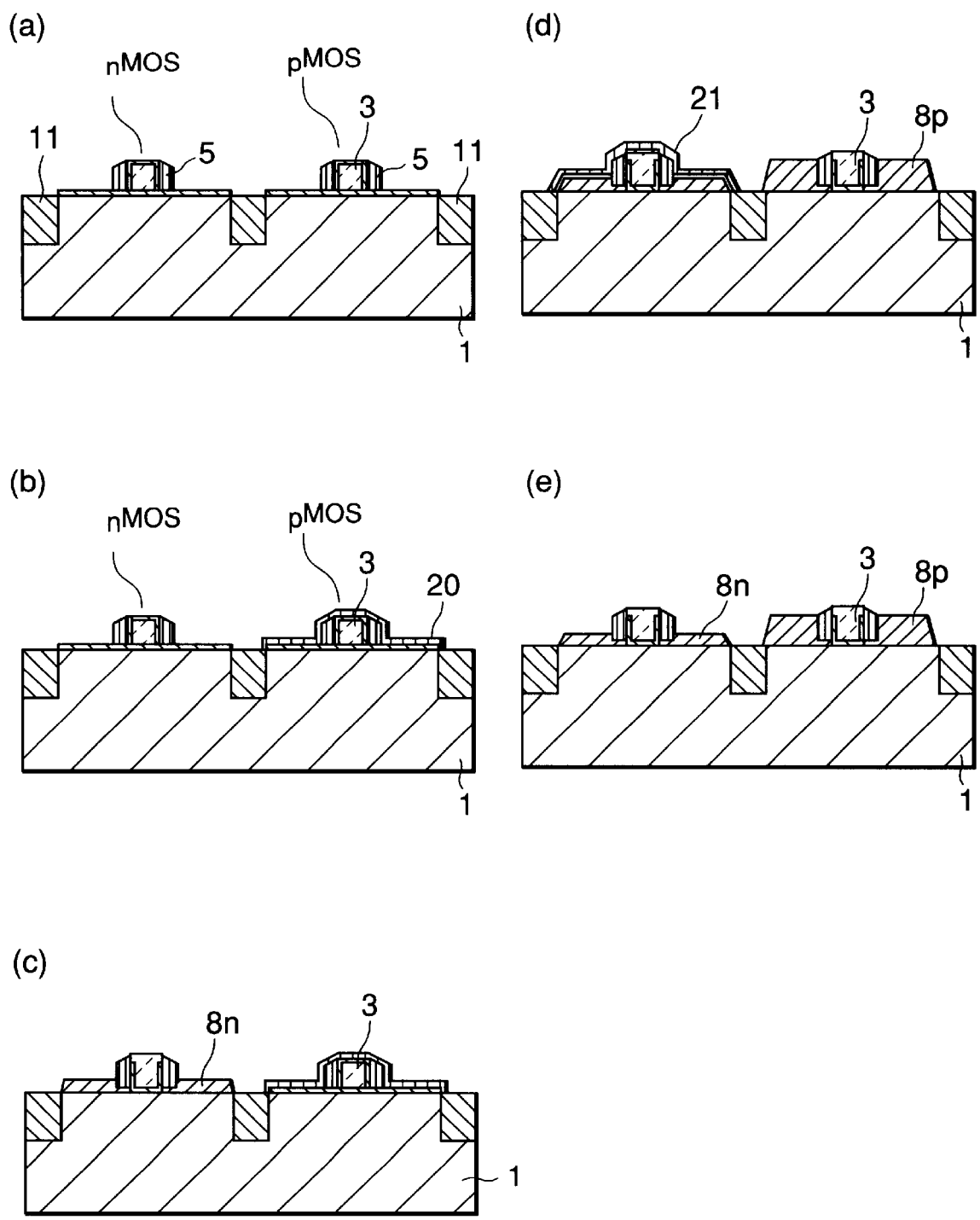
FIG. 16 shows schematic cross sectional views of the fifteenth embodiment of the present invention, illustrating different manufacturing steps (a) to (e) for manufacturing a CMOS transistor having elevated source/drain regions whose profiles differ between the n-MOS and the p-MOS.

FIGS. 16(a) to (e) shows the fifteenth embodiment of the present invention. The fifteenth embodiment differs from the first through fourteenth embodiment only in that the profile of the elevated source/drain region is differentiated between n-MOS and p-MOS. Firstly, the steps down to forming a second sidewall film 5 on a silicon substrate 1 having element isolation zones 11 as shown in FIG. 16(a) are followed for both n-MOS and p-MOS and then either one of them is covered by a mask as shown in FIG. 16(b). The case where silicon nitride film is used as the material of a mask for covering a p-MOS region of this embodiment will be described below. Thereafter, the elevated source/drain region of the n-MOS is etched in a manner as described above and an epitaxially grown layer 8n is formed (FIG. 16(c)). Subsequently, the n-MOS region is oxidized and a silicon nitride film 21 is formed to mask the region by deposition. Then, a p-MOS region having a p-MOS elevated source/drain region 8p is formed (FIG. 16(d)). Thereafter, the oxide film of the n-MOS region is removed (FIG. 16(e)).

At the time of forming n-MOS and p-MOS, the extent to which the oxide film on the source/drain region on the silicon substrate that operates as seed for epitaxial growth, the thickness of the epitaxially grown film, the type of metal or metal silicide on the elevated source/drain region can be differentiated between n-MOS and p-MOS so that the propagation delay time of the CMOS can be shortened if compared with a case where both n-MOS and p-MOS have a same profile. While n-MOS is formed first in the above description, p-MOS may alternatively be formed first for the embodiment.

(16th Embodiment)

Figure 17:
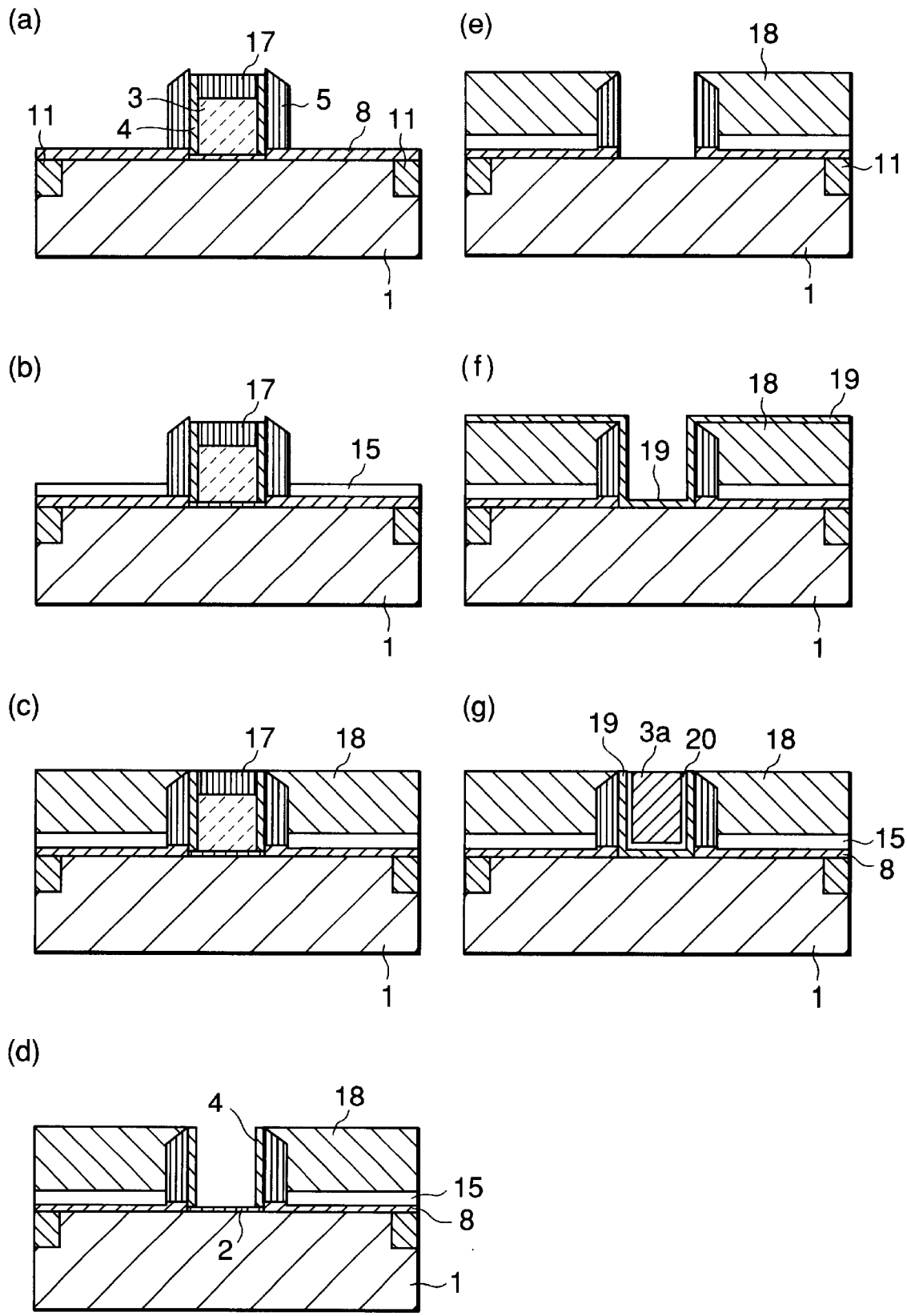
FIG. 17 shows schematic cross sectional views of the sixteenth embodiment of the present invention, illustrating different steps (a) to (g) of a method of manufacturing an MIS type transistor including a step of forming an elevated source/drain region and a damascene step.

FIGS. 17(a) and (g) shows the sixteenth embodiment of the present invention. This embodiment can be prepared like any of the first through fifteenth embodiments. However, this embodiment differs from the preceding embodiments only in that, after forming an elevated source/drain region and appropriately removing the dummy gate electrode region by etching, the gate is formed in a damascene gate step of burying the gate. Let us assume in the following description that a cap of silicon nitride film ($Si_3N_4$) 17 exists on the gate electrode. After forming an elevated source/drain region 8 by following the steps of FIGS. 2A(d) through 2C(j), the amorphous silicon on the $Si_3N_4$ 17 and the element isolation zone 11 is removed by etching (FIG. 17(a)) and the remaining amorphous silicon is partly turned into silicide 15 (FIG. 17(b)). Then, an interlayer insulating film 18 is formed by deposition and the upper surface of the silicon nitride film 17 on the gate electrode 3 that operates as mask is flattened by CMP (chemical mechanical polishing) (FIG.17(c)). Subsequently, after removing the silicon nitride film typically by means of thermal phosphor process, the gate electrode (polycrystalline silicon) is removed typically by means of CDE (chemical dry etching) (FIG. 17(d)). Then, the gate insulating film ($SiO_2$) 2 and the first side wall film (including the liner layer) 4 are removed by diluted hydrofluoric acid (DHF) (FIG. 17E) to expose the silicon substrate below the gate electrode 3. Thereafter, a gate insulating film 19 is newly formed either by oxidizing the silicon substrate region and, if exists, the elevated region or by depositing an insulating film (e.g., of tantalum oxide, titanium oxide or hafnium oxide) (FIG. 17(f)). If appropriate, an interface layer such as a nitride layer may be formed. When tungsten is selected for the metal material of the gate, after forming titanium nitride as reaction prevention film, tungsten is filled in the groove and flattened typically by CMP in order to bury a gate tungsten electrode 3a (FIG. 17(g)).

All the above described embodiments follow normal transistor forming steps thereafter. More specifically, an interlayer insulating film is deposited on the entire surface and a patterning operation is conducted for the gate contact hole. Subsequently, the contact hole is produced by anisotropic etching. Then, after laying titanium nitride as reaction prevention layer, aluminum is laid to wire the gate. The pattern of the gate lines is transferred onto resist by means of a patterning operation and the gate lines are completed by removing any unnecessary aluminum by etching. In the case of the sixteenth embodiment that is a damascene gate transistor, the gate insulating film can be formed after completing the steps that are conducted at high temperature above 700° C. including that of impaling ions into the source/drain, that of annealing and that of Si epitaxial growth. Any high temperature above 500° C. is no longer required after the step of forming the gate insulating film. This means that a high dielectric constant substance such as TiO2, Ta2O5 or BST whose physical properties can change at high temperature may be used for the gate insulating film to obtain a transistor that performs excellently.

The present invention is by no means limited to the above described embodiments, which may be modified appropriately without departing from the scope of the present invention. For instance, while the interlayer film and the gate material of the sixteenth embodiment are flattened by CMP, they may alternatively be flattened by etching back. The gate electrode may be formed by means of pattern and etching without using a step of flattening by CMP. The gate electrode may be made of aluminum, copper or some other metal instead of tungsten. The titanium nitride of the reaction prevention film may be replaced by tungsten nitride or tantalum nitride. If the electrode itself is made of polycrystalline silicon containing phosphor to a large extent instead of metal, no reaction prevention film is required. The gate insulating film may be made of any insulating material showing a high dielectric constant. In other words, the material of the gate insulating film is not limited to tantalum oxide. When the dummy gate is removed, the local threshold value may be regulated by implanting ions through the gate insulating film (buffer oxide film).

As pointed out above, the above embodiments may be modified appropriately without departing from the scope of the invention.

Thus, a semiconductor device having an elevated source/drain structure and a method of manufacturing the same according to the invention can effectively suppress the short channel effect and the generation of a leak current. Additionally, a semiconductor device according to the invention has a low resistance diffusion layer and shows a short propagation delay time. When a semiconductor according to the invention is a damascene transistor having an elevated source/drain region, the possible leak between the gate and the source or the drain can be minimized so that the gate can be effectively controlled relative to the channel.

What is claimed is:

1. A semiconductor device comprising:

a silicon substrate;

a gate insulating film formed on a surface of the silicon substrate;

a gate electrode formed on the gate insulating film;

a first side wall film formed on a side surface of the gate electrode;

an elevated region formed by epitaxial growth of silicon on the surface of the silicon substrate;

a second side wall film formed on the first side wall film, being made of different material from the first side wall film and separated from the surface of the silicon substrate by the elevated region; and a source region and a drain region formed in the silicon substrate and having a same conductive type with the elevated region, wherein the elevated region fills between the silicon substrate and the second side wall film to directly contact with a side surface of the first side wall film and a side surface of the second side wall film, and an angle between a side end plane of the elevated region contacted on the side surface of the first side wall film and the surface of the silicon substrate is a substantially obtuse angle.

2. The semiconductor device according to claim 1, wherein the vertical film thickness of the elevated region in an area surrounded by the substrate, the first side wall film and the second side wall film is greater than a gap between the substrate and the second side wall film.

3. The semiconductor device according to claim 1, wherein
the elevated region contains conductive type impurities beyond the solid solution limit.

4. The semiconductor device according to claim 1, wherein
the silicon substrate comprises an element isolation zone for the device and the elevated region is extended on at least a part of the element isolation zone.

5. The semiconductor device according to claim 4, wherein, when the distance of the elevated region which is laterally epitaxially grown on the element isolation zone is t, the thickness of the region is s, the angle between the side end plane of the elevated region on the element isolation zone and the corresponding surface of the semiconductor device is $\phi$, the requirement of $t > s/\tan \phi$ is met.

6. The semiconductor device according to claim 4, wherein the second side wall film is extended apart above the element isolation zone, and the elevated region formed by epitaxially growing on the source region or the drain region of the silicon substrate as seed is extended between the second side wall film above the element isolation zone and the element isolation zone.

7. The semiconductor device according to claim 4, wherein the metal or the silicide film of a refractory metal is formed only in the elevated region on the element isolation zone.

8. The semiconductor device according to claim 1, wherein the source region or the drain region contains a metal film or a silicide film of refractory metal.

9. The semiconductor device according to claim 1, wherein the gate electrode is made of metal.

10. The semiconductor device according to claim 1, wherein an angle $\theta$ between the side end plane of the elevated region contacted on the side surface of the first side wall film and the surface of the silicon substrate is defined by $\pi/2 < \theta < \pi$.

11. A semiconductor device comprising:

a silicon substrate;

a gate insulating film formed on a surface of the silicon substrate;

a gate electrode formed on the gate insulating film;

a first side wall film formed on a side surface of the gate electrode;

an elevated region formed by epitaxial growth of silicon on the surface of the silicon substrate;

a second side wall film formed on the first side wall film, being made of different material from the first side wall film and separated from the surface of the silicon substrate by the elevated region; and a source region and a drain region formed in the silicon substrate and having a same conductive type with the elevated region, wherein the silicon substrate comprises an element isolation zone for the device;

the second side wall film is extended apart above the element isolation zone;

the elevated region formed by epitaxially growing on the source region or the drain region of the silicon substrate is extended on at least a part of the element isolation zone; and a silicide layer is formed on the elevated region over the element isolation zone.

* * * * *